United States Patent
Tyler

(10) Patent No.: US 9,411,016 B2
(45) Date of Patent: Aug. 9, 2016

(54) TESTING OF A TRANSIENT VOLTAGE PROTECTION DEVICE

(75) Inventor: Peter Michael Tyler, Cheltenham (GB)

(73) Assignee: GE AVIATION SYSTEMS LIMITED, Cheltenham, Gloucestershire (GB)

( * ) Notice: Subject to any disclaimer, the term of this patent is extended or adjusted under 35 U.S.C. 154(b) by 467 days.

(21) Appl. No.: 13/327,973

(22) Filed: Dec. 16, 2011

(65) Prior Publication Data

US 2012/0153963 A1     Jun. 21, 2012

(30) Foreign Application Priority Data

Dec. 17, 2010   (GB) .................................. 1021430.2
Dec. 5, 2011    (GB) .................................. 1120802.2

(51) Int. Cl.
*G01R 31/02*    (2006.01)
*G01R 31/327*   (2006.01)
*G01R 31/00*    (2006.01)

(52) U.S. Cl.
CPC .......... *G01R 31/3277* (2013.01); *G01R 31/008* (2013.01); *G01R 31/024* (2013.01); *H01L 2924/0002* (2013.01)

(58) Field of Classification Search
CPC ..................................... G01R 31/327–31/3336
USPC .............. 324/415–424, 537, 762.07; 361/2, 8
See application file for complete search history.

(56) References Cited

U.S. PATENT DOCUMENTS

| | | |
|---|---|---|
| 3,964,530 A | 6/1976 | Nickles |
| 3,977,182 A | 8/1976 | Schroff |
| 3,999,449 A | 12/1976 | Chana et al. |
| 4,007,388 A | 2/1977 | Lawyer et al. |
| 4,157,496 A * | 6/1979 | St-Jean .......................... 324/415 |
| 4,158,949 A | 6/1979 | Reider |
| 4,180,972 A | 1/1980 | Herman et al. |
| 4,244,178 A | 1/1981 | Herman et al. |
| 4,269,032 A | 5/1981 | Meginnis et al. |
| 4,335,997 A | 6/1982 | Ewing et al. |
| 4,337,616 A | 7/1982 | Downing |
| 4,373,326 A | 2/1983 | Smale |

(Continued)

FOREIGN PATENT DOCUMENTS

| | | |
|---|---|---|
| CN | 2072230 U | 2/1991 |
| CN | 2619355 Y | 6/2004 |

(Continued)

OTHER PUBLICATIONS

Search Report and Written Opinion from FR Application No. 1161732 dated Jul. 23, 2013.

(Continued)

*Primary Examiner* — Patrick Assouad
*Assistant Examiner* — Demetrius Pretlow
(74) *Attorney, Agent, or Firm* — GE Global Patent Operation; William S. Munnerlyn

(57) ABSTRACT

A method of testing a voltage protection device in a circuit is provided. The circuit comprises a source and load and a detector is provided in parallel with the protection device. The method comprises opening a switching device provided in the circuit. The method further comprises detecting a property of a voltage spike caused by the rate of change of current in the circuit inductance produced by the opening of the switching device to determine the condition of the protection device.

8 Claims, 3 Drawing Sheets

(56) References Cited

U.S. PATENT DOCUMENTS

| | | | |
|---|---|---|---|
| 4,387,563 A | 6/1983 | Bell | |
| 4,426,841 A | 1/1984 | Cornelius et al. | |
| 4,470,756 A | 9/1984 | Rigo et al. | |
| 4,480,958 A | 11/1984 | Schlechtweg | |
| 4,484,136 A | 11/1984 | Tuttle | |
| 4,502,635 A | 3/1985 | Klomp et al. | |
| 4,901,527 A | 2/1990 | Nash et al. | |
| 4,916,906 A | 4/1990 | Vogt | |
| 5,020,318 A | 6/1991 | Vdoviak | |
| 5,080,555 A | 1/1992 | Kempinger | |
| 5,083,422 A | 1/1992 | Ogt | |
| 5,183,389 A | 2/1993 | Gilchrist et al. | |
| 5,256,973 A * | 10/1993 | Thee et al. | 324/418 |
| 5,257,909 A | 11/1993 | Glynn et al. | |
| 5,261,790 A | 11/1993 | Dietz et al. | |
| 5,270,658 A * | 12/1993 | Epstein | G01R 31/3272 324/424 |
| 5,302,085 A | 4/1994 | Dietz et al. | |
| 5,302,086 A | 4/1994 | Kulesa et al. | |
| 5,369,882 A | 12/1994 | Dietz et al. | |
| 5,815,353 A | 9/1998 | Schwenkel | |
| 5,936,508 A * | 8/1999 | Parker | 337/241 |
| 5,970,430 A | 10/1999 | Burns et al. | |
| 6,354,803 B1 | 3/2002 | Grover et al. | |
| 6,398,486 B1 | 6/2002 | Storey et al. | |
| 6,439,616 B1 | 8/2002 | Karafillis et al. | |
| 6,722,466 B1 | 4/2004 | Tong et al. | |
| 6,738,245 B2 * | 5/2004 | Ely | 361/91.1 |
| 6,769,865 B2 | 8/2004 | Kress et al. | |
| 6,857,853 B1 | 2/2005 | Tomberg et al. | |
| 6,923,616 B2 | 8/2005 | Mcrae et al. | |
| 6,963,044 B2 | 11/2005 | Fusaro et al. | |
| 6,984,112 B2 | 1/2006 | Zhang et al. | |
| 7,053,624 B2 * | 5/2006 | Klijn et al. | 324/415 |
| 7,090,466 B2 | 8/2006 | Honkomp et al. | |
| 7,097,429 B2 | 8/2006 | Athans et al. | |
| 7,119,597 B1 * | 10/2006 | Barrett | G01R 31/14 324/527 |
| 7,131,817 B2 | 11/2006 | Keith et al. | |
| 7,144,215 B2 | 12/2006 | Keith et al. | |
| 7,147,440 B2 | 12/2006 | Benjamin et al. | |
| 7,189,063 B2 | 3/2007 | Honkomp | |
| 7,198,467 B2 | 4/2007 | Keith et al. | |
| 7,207,776 B2 | 4/2007 | Townes et al. | |
| 7,238,008 B2 | 7/2007 | Bobo et al. | |
| 7,244,101 B2 | 7/2007 | Lee et al. | |
| 7,251,941 B2 | 8/2007 | Koshoffer et al. | |
| 7,322,797 B2 | 1/2008 | Lee et al. | |
| 7,341,429 B2 | 3/2008 | Montgomery et al. | |
| 7,435,049 B2 | 10/2008 | Ghasripoor et al. | |
| 7,436,644 B2 * | 10/2008 | Nagai et al. | 361/160 |
| 7,600,972 B2 | 10/2009 | Benjamin et al. | |
| 7,731,482 B2 | 6/2010 | Lagrange et al. | |
| 7,766,621 B1 | 8/2010 | Maggs et al. | |
| 8,083,475 B2 | 12/2011 | Bulgrin et al. | |
| 8,573,942 B2 | 11/2013 | Strohl et al. | |
| 2001/0019573 A1 * | 9/2001 | Dougherty et al. | 374/4 |
| 2003/0214302 A1 * | 11/2003 | Slamecka | G01R 31/3336 324/424 |
| 2004/0012393 A1 * | 1/2004 | Schmalz et al. | 324/424 |
| 2004/0148513 A1 | 7/2004 | Scott et al. | |
| 2005/0030693 A1 * | 2/2005 | Deak et al. | 361/160 |
| 2006/0238363 A1 * | 10/2006 | Johnson | 340/638 |
| 2007/0146945 A1 * | 6/2007 | Zhang et al. | 361/42 |
| 2007/0285266 A1 * | 12/2007 | Angle et al. | 340/638 |
| 2008/0055797 A1 * | 3/2008 | Wardzala | H02H 9/042 361/18 |
| 2008/0181779 A1 | 7/2008 | Decardenas | |
| 2009/0160425 A1 * | 6/2009 | Berland et al. | 324/67 |
| 2010/0023286 A1 * | 1/2010 | Rodseth et al. | 702/65 |
| 2010/0129226 A1 | 5/2010 | Strohl et al. | |
| 2010/0164717 A1 | 7/2010 | Hammer et al. | |
| 2010/0178173 A1 | 7/2010 | Charlton | |
| 2012/0119918 A1 * | 5/2012 | Williams | 340/664 |
| 2013/0136618 A1 | 5/2013 | Stapleton | |
| 2014/0294587 A1 | 10/2014 | Dupeyre et al. | |

FOREIGN PATENT DOCUMENTS

| | | |
|---|---|---|
| CN | 1580496 A | 2/2005 |
| CN | 201094134 Y | 7/2008 |
| CN | 201166694 Y | 12/2008 |
| CN | 101787903 A | 7/2010 |
| DE | 3539421 A1 | 5/1987 |
| DE | 102007026244 A1 | 12/2008 |
| EP | 0091865 A1 | 10/1983 |
| EP | 2053285 A1 | 4/2009 |
| EP | 2530546 | 12/2012 |
| JP | 2004297849 A | 10/2004 |
| JP | 2006087227 A | 3/2006 |
| JP | 3148975 U | 3/2009 |
| JP | 2009243427 B2 | 10/2009 |

OTHER PUBLICATIONS

Search Report from corresponding GB Application No. 1120802.2 Mar. 9, 2012.

PCT Search Report and Written Opinion issued in connection with corresponding PCT Application No. PCT/US2014/012258 on May 13, 2014.

European Search Report and Opinion issued in connection with corresponding EP Application No. 12194394.8 on May 14, 2014.

Unofficial English Translation of Chinese Office Action issued in connection with corresponding CN Application No. 201110463195.X on Feb. 15, 2015.

Chinese Office Action issued in connection with corresponding CN Application No. 201210493673.6 on Mar. 17, 2015.

European Office Action issued in connection with corresponding EP Application No. 12194394.8 on Jul. 9, 2015.

Unofficial translation of CN Search Report dated Mar. 17, 2015 in connection with related CN Application 201210493673.6.

Unofficial English translation of Japanese Office Action issued in connection with corresponding JP Application No. 2011275228 Nov. 4, 2015.

* cited by examiner

TESTING OF A TRANSIENT VOLTAGE PROTECTION DEVICE

BACKGROUND OF THE INVENTION

1. Field of the Invention

The present disclosure relates to testing of voltage protection devices, in particular, during the in-service life of a product.

2. Description of the Prior Art

Transient voltage protection devices are relied upon to protect sensitive electronic circuits from lightning strikes, faults and other transients which could cause damage to the circuits. Any faults in the protection devices themselves can have serious safety implications, particularly on aerospace products.

Conventionally, transient voltage protection devices are only thoroughly tested by the device manufacturer. They may not generally be re-tested, even when they are assembled into a printed circuit board (PCB). Consequently, this could allow some types of faults to remain undetected leaving the circuits unprotected.

BRIEF SUMMARY OF THE INVENTION

According to an embodiment of the present invention, a method of testing a voltage protection device in a circuit is provided. The circuit comprises a source and load and a detector is provided in parallel with the protection device. The method comprises opening a switching device provided in the circuit. The method further comprises detecting a property of a voltage spike caused by the rate of change of current in the circuit inductance produced by the opening of the switching device to determine the condition of the protection device.

According to another embodiment of the present invention, a protection device tester for testing a protection device in a circuit is provided. The circuit comprises a source and load. The protection device tester comprises a detector provided in parallel to the protection device and configured to detect a property of the voltage spike produced by opening a switching device provided in the circuit. The protection device tester further comprises a controller configured to determine the condition of the protection device based on the detected property of the voltage spike produced by the opening of the switching device.

BRIEF DESCRIPTION OF THE DRAWINGS

Embodiments of the present invention will now be described, by way of example only, with reference to the accompanying drawings, in which.

DETAILED DESCRIPTION OF THE INVENTION

Figure 1:
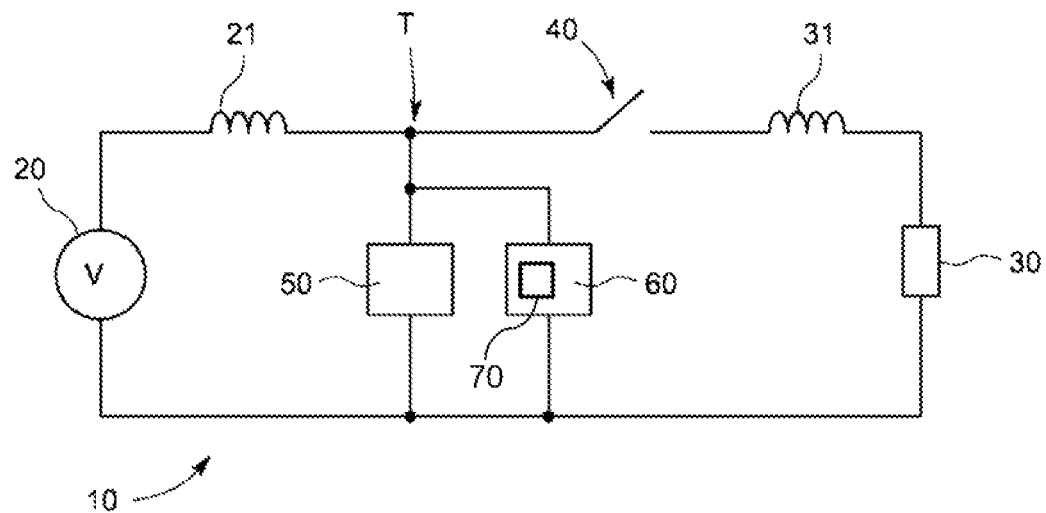
FIG. 1 shows a circuit provided with a protection device tester in accordance with an embodiment of the present invention.

FIG. 1 illustrates an example of a voltage protection device tester provided in a circuit. The circuit 10 has a voltage source 20, a load 30 and a switching means 40 provided therebetween. The circuit 10 may, for example, be provided on an aircraft such that the voltage source 20 may be provided by an engine generator and the load 30 may be a component on the aircraft, such as to actuate a component of the aircraft such as a flap or the under carriage or a component within the aircraft such as instrumentation or in-flight entertainment. The switching means 40 may be an individual switch, a plurality of switches or a power switching circuit for example, such as a solid state power controller. A solid state power controller may, for example, comprise one or more parallel connected semiconductor devices. The switching circuit 40 is used to connect the power source 20 to the load 30. The voltage source 20 and its associated cabling or wiring will have an inherent inductance 21. Likewise, the load 30 and its associated cabling and wiring will have an inherent inductance 31.

A protection device 50, in this example a transient voltage protection device, is provided across the voltage source 20. A detector 60 is provided in parallel with the protection device 50 for detecting a property of the voltage spike produced by opening the switching device 40. The detector 60 which may be provided, as hardware or software detects a property such as peak voltage, duration, slope, etc. of the voltage spike which is used to determine a condition of the protection device 50 such as whether it is working satisfactorily. The detected property may also be used to determine whether there is any non-ideal or potential problems developing in the protection device 50 or a part of the circuit 10.

The switching device 40 may, as explained above, comprise a solid state power controller (SSPC) which may comprise one or a plurality of connected semiconductor devices. If it comprises a plurality of parallel connected semiconductor devices, then they may be operated individually or in any combination to obtain a voltage spike.

Figure 2:
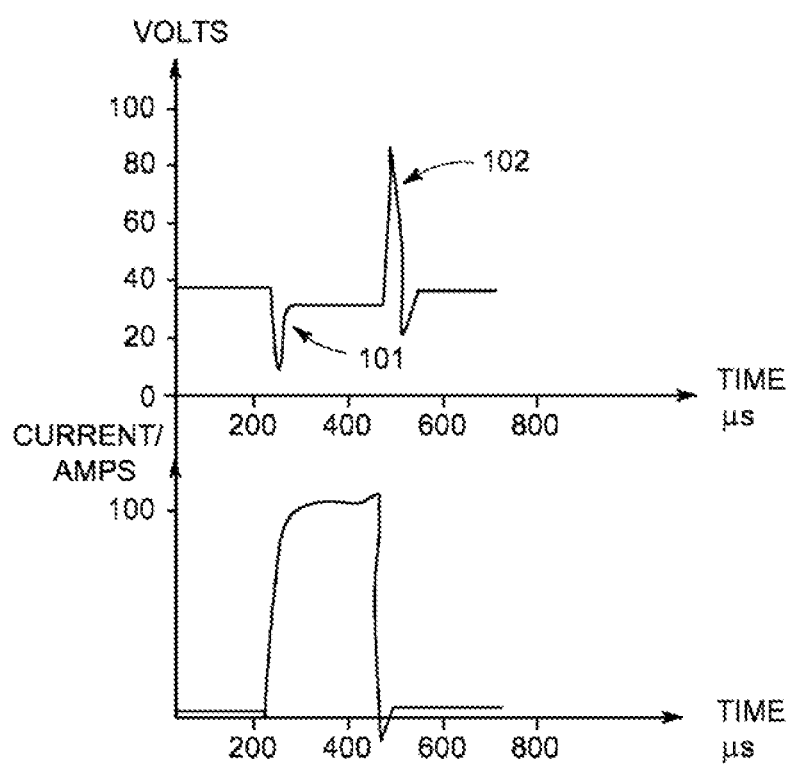
FIG. 2 shows voltage spikes at point T produced by the closing and opening of a switching device in the circuit of FIG. 1.

FIG. 2 illustrates voltage spikes at point T in FIG. 1 produced by closing and opening the switching device 40 illustrated in FIG. 1. As can be seen, when the switching device 40 is closed or turned "on" at about 250 µs, the current through the switching device 40 quickly rises to that provided by the source 20, in this example approximately 100 Amps. As can also be seen in FIG. 2, as the current through the switching device 40 increases, a first negative spike 101 is seen by the detector 60. When the switching device 40 is opened or turned "off", in this example at just before 500 µs, a positive voltage spike 102 is seen by the detector 60.

The voltage protection device 50 does not conduct when the switching device 40 is closed or turned "on". It only conducts when the switching device 40 is opened or turned "off". For a DC circuit, the positive side of voltage protection device 50 is at point T so it conducts when the switching device 40 is opened or turned "off" which generates the positive voltage spike 102.

If the switching device 40 comprises a plurality of switches, then the switches may be operated individually or in any combination to obtain a voltage spike.

Figure 3:
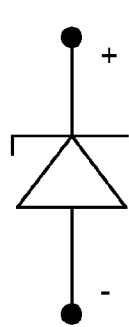
FIG. 3 is an example of a voltage protection detection device for a circuit with a DC current.

FIG. 3 illustrates an example of a voltage protection device 50 which may be used in an embodiment of the present invention. In this example, the voltage protection device 50 comprises a transorb which is similar to a Zener diode which may be suitable for a DC supply 20.

Figure 4A:
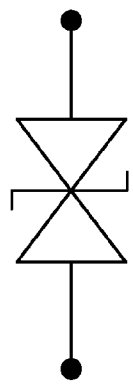
FIGS. 4a and 4b show two examples of voltage protection devices for a circuit with an AC current.
Figure 4B:
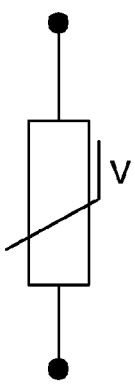

FIG. 4a illustrates a voltage protection device 50 which comprises a bidirectional transorb which is similar to two reverse connected Zener diodes. This may be used in the circuit of FIG. 1 with an AC supply 20. An alternative AC voltage protection device which performs the same function is a Metal Oxide Varistor as shown in FIG. 4b.

Figure 5:
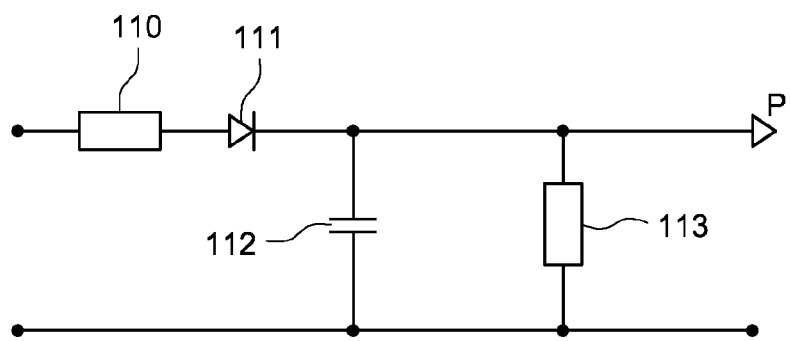
FIG. 5 is an example of a peak voltage detector which may be used in accordance with an embodiment of the present invention.

Although the detector 60 may detect any desired property of the voltage spike to determine the condition of the protection device, it has been found that detecting the peak voltage of the spike provides a reliable indication of the condition of the protection device 50 and is also able to be measured precisely and repeatedly. The peak voltage of the voltage spike may be measured in any suitable way, such as using software or hardware. FIG. 5 illustrates a suitable hardware peak spike voltage detector which may be used in an embodiment of the present invention. The peak voltage detector has a charging resistor 110 connected in series with a diode 111 and a capacitor 112 which is charged by the voltage spike. The charge on the capacitor 112 is measured at the point P providing an indication of the peak voltage of the spike. The charged capacitor 112 is then discharged through the resistor 113 which is generally much larger than the charging resistor 110.

A suitable controller, 70, such as a microprocessor which may, for example, be provided within the detector arrangement 60 shown in FIG. 1 or within other controlling electronics associated with the circuit 10 may be used to determine a condition of the protection device 50 based on the detected property of the voltage spike. For example, when measuring the peak voltage detected, a controller may use a look-up table or an algorithm to determine whether the detected peak voltage is within an expected predetermined range such that the voltage protection device 50 may be considered to be working satisfactorily or whether the detected peak voltage is outside a predetermined expected range indicating that the voltage protection device is working unsatisfactorily or has a fault. Whether the measured property is below or above the predetermined range or a predetermined value may indicate the nature of the fault. For example, if a measured peak voltage is below a predetermined value or range this may indicate a partial short circuit in the voltage protection device 50. Conversely if a measured peak voltage is above a predetermined value or predetermined range this may indicate a high impedance or an open circuit in the voltage protection device 50. Furthermore, how much a measured property is above or below an expected predetermined value or range may also indicate how serious a fault is.

In the example voltage spike 102 shown in FIG. 2, the peak of the spike 102 is about 90V. Different circuits and applications will have different determined ranges to indicate satisfactory operation. For example, if a detected voltage peak is above 100 V or below 70 V, this may be indicative of a fault. If a peak voltage is above or below the expected value, in this case 90 V, this may be indicative of non-ideal operation of the circuit or a component even if it is within the expected range and so may suggest further investigation.

The embodiment of the present invention described above with reference to FIG. 1 generally has some inductance 21 in the input power supply 20 and its associated cabling or wiring. If this inherent inductance 21 is too small to produce a voltage spike with measurable properties, then a suitable inductor may be provided in the cabling or wiring associated with the source 20.

Figure 6:
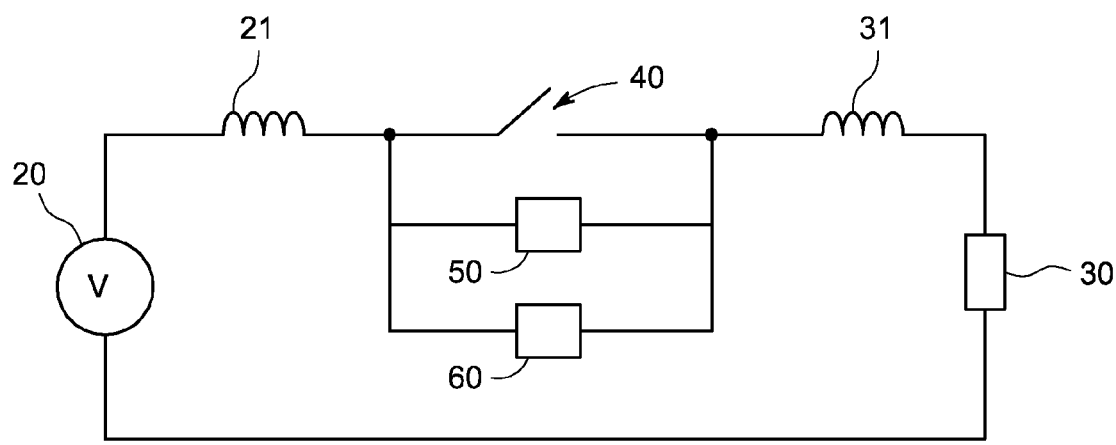
FIG. 6 illustrates an embodiment of the present invention the present invention.

FIG. 6 illustrates a second example of a circuit illustrating an embodiment of the present invention. This example differs from the circuit of FIG. 1 by the voltage protection device 50 being provided between the source 20 and the output load 30. As in the example of FIG. 1, the switching device 40 may be a single switch or a plurality of switches. If the switching device 40 is a plurality of switches, the plurality of switches may be provided in parallel and may, for example, be a plurality of parallel connected semiconductor devices, such as a solid state power controller (SSPC) used to connect the source 20 to the load 30. As in the example of FIG. 1, the transient voltage protection device 50 has a detector 60 connected across it in parallel. As before, the protection device may be tested by measuring a property of the voltage spike produced by the opening of the switching device 40 or by opening and closing the parallel connected semiconductor devices individually or in any combination to determine the condition of the protection device 50.

As in the examples shown in FIG. 1, if there is insufficient inherent inductance in the circuit to provide a large enough voltage spike to make the protection device conduct, then an inductor may be added accordingly.

An advantage of embodiments of the present invention is that the voltage spikes produced are larger than those that occur at normal load currents and therefore provide clearly measurable values which may be used to determine the condition of the protection device, in particular whether or not it has a fault or is likely to develop a fault.

The size of the positive voltage spike 102 which is detected to determine the condition of the protection device 50 is dependent upon the inductance L in the circuit and the rate of change of current dI/dt when the switching device 40 is opened. The size of the voltage spike V upon opening the switching device 40 is given by the following equation $$V = L \times dI/dt$$

The inherent inductance in the circuit and typical rate of change of current upon opening the switch have been generally found to be suitable to produce a voltage spike of sufficient size for clear and repeatable measurements. However, if required, larger voltage spikes may be produced when required by either or both of including an additional inductor L in the circuit or providing a higher current I.

Figure 7:
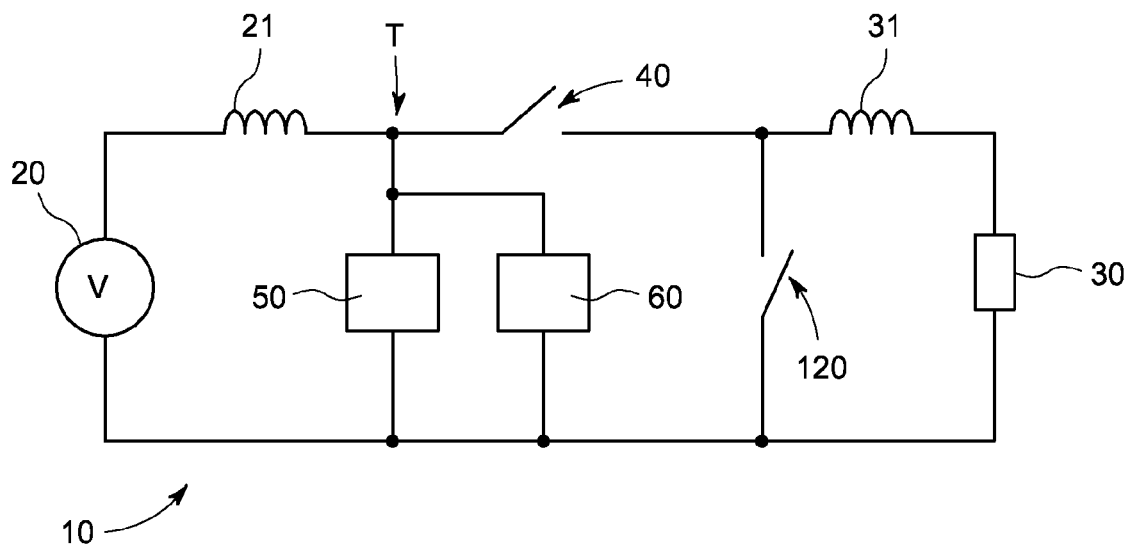
FIG. 7 shows a modified version of the circuit shown in FIG. 1 provided with a short circuit arranged to be applied across an output of the circuit.

As illustrated in FIG. 7, which corresponds to FIG. 1 with the inclusion of a short-circuiting switch 120 to the output, a higher current, typically 5 to 10 times its normal current is provided when the switching device 40 is closed after previously closing the short-circuiting switch 120, thus inducing a considerably larger voltage spike to test the protection device, even if the circuit inductance L is quite low. A considerable advantage of the use of the output short circuit 120 is that a current much higher than the normal load current can be used for the test without applying a significant voltage to the output load.

Figure 8:
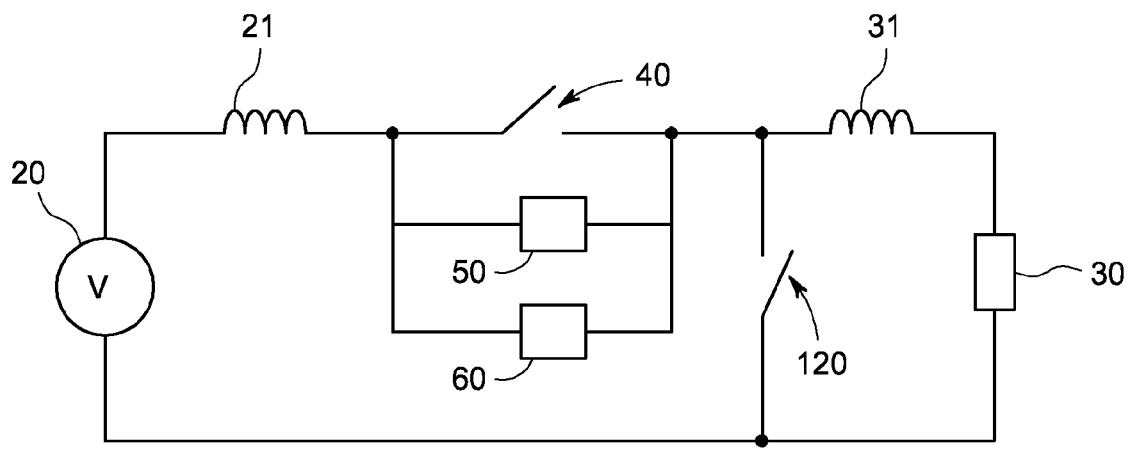
FIG. 8 shows a modified version of the circuit shown in FIG. 6 provided with a short circuit arranged to be applied across an output of the circuit.

FIG. 8 shows a circuit equivalent to that of FIG. 6 also provided with a short circuit pull-down 120 on the output.

Figure 9:
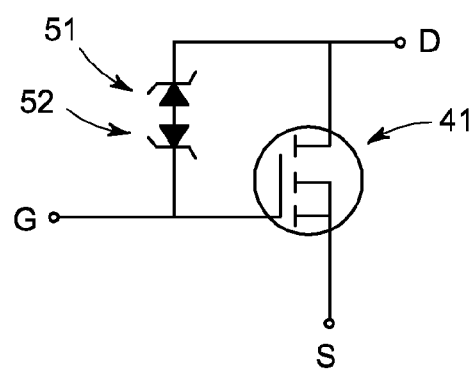
FIG. 9 shows a switching device and protection device provided, as a single component block.

Although the examples described above show the switching device 40 and protection device 50 as separate components, they could be combined into a single component block. For example, as shown in FIG. 9, the switching device 40 may include one or more transistors 41, such as one or more field effect transistors or MOSFETs. The protection function may be provided by two small, low cost zener diodes 51, 52 connected between the gate (G) and drain (D) of the or each transistor 41. These zener diodes force the transistor 41 to conduct heavily when an excess voltage is applied between the drain and source thus preventing this voltage from exceeding the breakdown voltage of the transistor. By appropriate choice of zener diodes, this configuration provides effective self-protection against excess voltage across the or each transistor 41 in the same way as with the protection devices 50 illustrated above, whilst still being able to be tested as in the above examples with a detector 60 connected around it to the drain (D) and source (S). The transistor 41 is turned on or off by an appropriate signal applied to the gate (G) of the transistor 41.

An advantage of embodiments of the present invention is that the voltage spike produced by the opening of a switch is generally larger and more well defined than when normal load currents are switched. Consequently, a sufficiently large voltage spike to test a voltage protection device can be generated even in circuits with relatively low inductances. If necessary, additional inductance may be provided in the circuit or a short circuit may be applied across an output of the circuit to increase the rate of change of current in the circuit inductance when the switching device is opened and so produce a large enough voltage spike to make the protection device conduct.

Whilst examples have been described in detail above, many variations may be made to these examples without departing from the present invention. For example, the switching device 10 may be an individual switch or a plurality of switches. If used with a plurality of switches, these may be provided in parallel and each switch may be a solid state device such that the switching device 40 is a solid state power controller (SSPC). Embodiments of the present invention may be used in DC systems or AC systems. If used with an AC system and with the switching device 40 as a plurality of semiconductor devices, these semiconductor devices would be AC switches and the voltage protection device would be bidirectional as shown in FIG. 4a or FIG. 4b and may provide symmetrical positive and negative protection.

What is claimed is:

1. A protection device tester for testing a protection device in a circuit comprising a source and load, the protection device tester comprising:

a detector electrically connected in parallel to the protection device to detect a property of a voltage spike produced by opening a switching device provided in the circuit; and a controller provided within the detector to determine a condition of the protection device based on the detected property of the voltage spike produced by the opening of the switching device, wherein the switching device comprises a plurality of switches, wherein the switches are semiconductor devices electrically connected in parallel to be opened or closed individually.

2. The protection device tester according to claim 1, wherein the controller determines the condition of the protection device based on whether the detected property of the voltage spike produced by the opening of the switching device is within a predetermined range.

3. The protection device tester according to claim 1, wherein the controller determines the condition of the protection device based on whether the detected property of the voltage spike produced by the opening of the switch is above or below a predetermined value.

4. The protection device tester according to claim 1, wherein the controller determines the condition of the protection device based on how much the detected property of the voltage spike produced by the opening of the switch is above or below a predetermined value or range.

5. The protection device tester according to claim 1, wherein the detector detects the peak voltage of the voltage spike.

6. The protection device tester according to claim 1, further comprising a short circuit to be applied across an output of the circuit before opening the switching device.

7. The protection device tester according to claim 1, wherein the detector includes a charging resistor electrically connected in series with a diode and a capacitor that is charged by the voltage spike.

8. The protection device tester according to claim 7, wherein the condition of the protection device is determined based in part on a measured charge on the capacitor.

* * * * *